United States Patent [19]

Young et al.

[11] Patent Number: 4,958,105
[45] Date of Patent: Sep. 18, 1990

[54] ROW DRIVER FOR EL PANELS AND THE LIKE WITH INDUCTANCE COUPLING

[75] Inventors: Edward L. Young, Shelton; Mohan L. Kapoor, Orange, both of Conn.

[73] Assignee: United Technologies Corporation, Hartford, Conn.

[21] Appl. No.: 282,787

[22] Filed: Dec. 9, 1988

[51] Int. Cl.$^5$ .............................................. G09G 3/30
[52] U.S. Cl. .............................. 315/169.3; 315/169.1; 340/781
[58] Field of Search ........................... 315/169.3, 169.1; 340/781

[56] References Cited

U.S. PATENT DOCUMENTS

| | | | |
|---|---|---|---|
| 4,070,663 | 1/1978 | Kanatani et al. | 340/781 X |
| 4,527,096 | 7/1985 | Kindlmann | 315/169.3 |
| 4,570,159 | 2/1986 | Criscimagna et al. | 315/169.1 X |
| 4,707,692 | 11/1987 | Higgins et al. | 340/781 X |
| 4,866,349 | 9/1989 | Weber et al. | 315/169.3 X |

Primary Examiner—Eugene R. LaRoche
Assistant Examiner—Do Hyun Yoo

[57] ABSTRACT

A simplified row driver switching circuit for display panels and the like, including particularly electroluminescent (EL) panels, as well as plasma panels, using inductance coupling between the power supply and the row electrodes. The circuit limits energy transfer to each row electrode of the EL panel through the inductance coupling, minimizing the effects of destructive arcing caused by inter-electrode shorts. The circuit is energy conservative and eliminates the need for, for example, −160 V and +220 V power supplies. Two row driver circuits are disclosed (FIGS. 4 & 6), the latter allowing the row electrodes to be driven to negative, as well as positive, voltages. Inductor(s) (L of FIG. 4; $L_1$ & $L_2$ of FIG. 6) are used to store and transfer energy to the row electrode load ($C_{panel}$) and then back to the power source ($V_{in}$), as various switches are pulsed "on" and released. The same power supply can be used for both the row driver and the column driver (FIG. 7).

15 Claims, 4 Drawing Sheets

ROW DRIVE WAVEFORM

ROW DRIVER FOR EL PANELS AND THE LIKE WITH INDUCTANCE COUPLING

DESCRIPTION

1. Reference to Related Application

This application relates to some of the same subject matter as co-pending application Ser. No. 282,147, filed concurrently herewith, entitled "Row Driver for Electroluminscent Panels And the Like With Transformer Coupling" by the same inventors hereof, the disclosure of which is incorporated herein by reference.

2. Technical Field

This invention relates to electrical panels used for, for example, displays of information, including particularly electroluminescent (EL) panels, as well as, for further example, plasma panels, and more particularly to a row driver therefor. Even more particularly, the present invention relates to the use of inductor coupling in such circuits.

3. Background Art

An electrically driven panel, such as an electroluminescent (EL) panel, is used to display indicia in response to appropriate electrical signals imposed upon its electrodes.

The typical electrical model of an electroluminescent (EL) display panel includes horizontal (row) and vertical (column) electrodes of finite resistance with an inter-electrode capacitance evenly distributed along the length of each electrode, with such a model being illustrated in FIG. 1. A row driver working through row switches appropriately drives the row electrodes. A column driver (not illustrated) drives the column electrodes through a bank of column switches. Separate power supplies (not illustrated) typically are provided to separately power the row and column drivers.

The row driver for such an EL panel has two separate modes of operation. In the write mode, each row typically is pulsed sequentially down to $-160$ V (volts), while the column voltages determine the pixel intensities along the row being addressed. In the refresh mode, all rows are typically simultaneously pulsed up to $+220$ V, while the columns are all maintained at zero volts. A typical, prior art row drive wave form is graphically illustrated in FIG. 2, showing the relative voltage levels which occur in the row driver through each cycle.

The column electrodes have a relatively high resistance, since they are generally made of a thin-film transparent material. For this reason each column driver sees a load equivalent to a delay line. Each row electrode, however, has a low resistance, and for all practical purposes the row driver sees a purely capacitive load. This type of load enables the use of the resonant row drive scheme of the present invention.

It is noted that some EL panels do not exhibit purely capacitive loads or characteristics, but even these types of panels effectively could be made into a purely capacitive load by adding external capacitance to the panel. Such a panel, so modified or supplemented, would then present an essentially capacitive load, then allowing the use of the resonant row drive scheme of the present invention.

FIG. 3 schematically shows a typical row driver circuit of the prior art. Initially all switches are "off" except switch $S_1$. In order to produce a $-160$ V write pulse on the EL panel's row electrodes, schematically illustrated in the circuit as the capacitive load $C_{panel}$, switch $S_4$ is turned "on," coupling the panel $C_{panel}$ to $-160$ V through switch $S_1$, diode $D_3$, and switch $S_4$.

If switch $S_4$ is released and switches $S_5$ and $S_6$ are activated, the capacitive row panel load $C_{panel}$ switches back to zero volts. Now, with switch $S_1$ "off" and $S_2$ activated, the bottom or negative side of the capacitor $C_1$ is raised to $+60$ V, while the top (positive side) of capacitor $C_1$ is raised to $+220$ V, since capacitor $C_1$ already had a charge of $+160$ V across it. A $+220$ V refresh pulse can now be generated at the panel load $C_{panel}$ by switching switch $S_3$ "on." When the switch $S_3$ is released and switches $S_5$ and $S_6$ are activated, the panel load $C_{panel}$ again will return to zero volts.

The foregoing describes the typical prior art row driver system for EL panels, and such a circuit has significant disadvantages. It requires dual regulated, relatively high voltage supplies ($-160$ V & $+60$ V) to drive the EL panel's row electrode load $C_{panel}$. Also, such a prior art drive scheme is not energy efficient.

Additionally, in the prior art design an electrode short on the panel could destroy expensive driver integrated circuits (ICs) and cause the electrode to burn out on the panel itself.

DISCLOSURE OF INVENTION

The row driver circuit of the present invention has significant advantages over the previous design.

As noted, the previous linear row drive scheme of FIG. 3 requires dual regulated, relatively high voltage supplies to drive the EL panel $C_{panel}$. The new driver circuit, as described in detail with respect to, for example, either FIGS. 4 or 6, requires only one power source, which can be unregulated, if so desired. In fact, the row driver of the invention can use the same $+60$ V power source typically required in the EL column driver circuit.

In the present invention electrical energy from the power supply is stored in an inductor and then transferred to the row electrode. The inductor then is re-energized and dumps the energy back to the power supply. This makes the driver more energy efficient. Thus, the invention's driver circuit is power conservative, since almost all of the energy transferred to the panel's row electrode load $C_{panel}$ is eventually returned to the power source.

One of the most significant advantage of the drive concept of the present invention is that it limits damage due to inter-electrode shorts on the EL panel, by limiting energy transfer to each row.

In the previous, prior art design, as noted above, an electrode short on the panel could destroy expensive driver integrated circuits (ICs) or semiconductor components and cause the electrode on the panel itself to burn out. In the prior art design, since the row electrodes of the panel are connected directly through switch $S_1$, diode $D_3$ & switch $S_4$ during the "write" pulse, the load $C_{panel}$ is connected directly to the $-160$ V power supply, which is capable of destructive current levels.

In contrast, in the design of the invention, the row electrodes of the panel are connected to the power supply only through the inductor coupling, and therefore can receive only a limited amount of energy during each "write" pulse. As pulses are applied to the inductor drive switch ($S_1$ below), the energy stored in the inductor (L below) is limited by the "on" time of the drive switch. The row load therefore will never "see"

any energy in excess of that amount. By the invention's limiting the energy transfer to the row, IC component stresses are reduced to non-destructive levels, and a short on the EL panel will not have sufficient energy to destroy the electrode and require panel and/or integrated circuit or semiconductor component replacement.

The circuit concepts, described herein in connection with FIGS. 4 & 6 and an EL panel, may be applied to other like panels, including alternating current (AC), thin film plasma panels. However, the invention is particularly applicable to electroluminescent drive schemes.

The foregoing and other features and advantages of the present invention will become more apparent from the following further description and drawings.

BEST MODES FOR CARRYING OUT THE INVENTION

Figure 1:
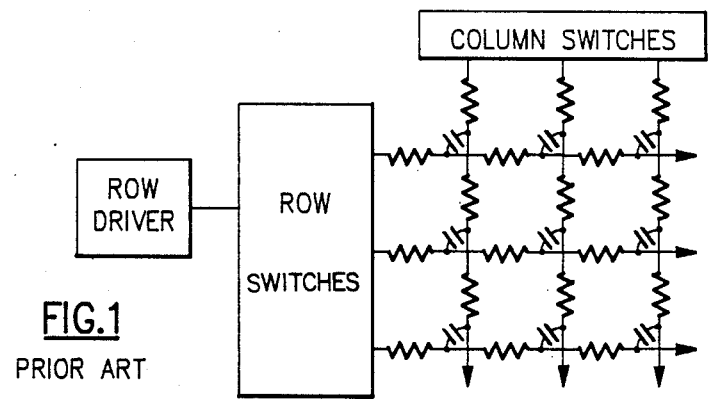
FIG. 1 is a generalized schematic of an electrical model of an exemplary, standard, electroluminescent panel, including its horizontal and vertical electrodes of finite resistance with an inter-electrode capacitance evenly distributed along the length of each electrode, of the prior art, with which EL panel the row driver circuit of the present invention can be used.
Figure 2:
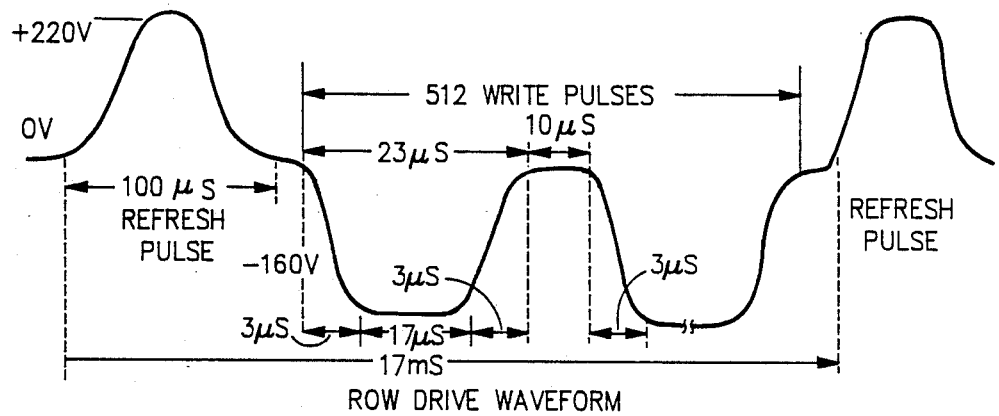
FIG. 2 is a graphical illustration of an exemplary row driver wave form of the prior art showing the varying positive and negative voltage levels of the prior art row driver during each cycle.
Figure 3:
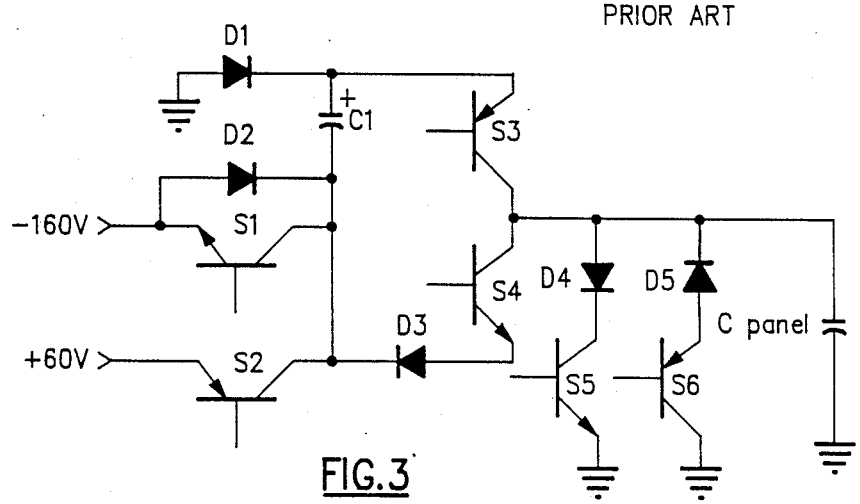
FIG. 3 is a schematic diagram of an exemplary row driver circuit of the prior art for the model of FIG. 1 producing the wave form of FIG. 2.
Figure 4:
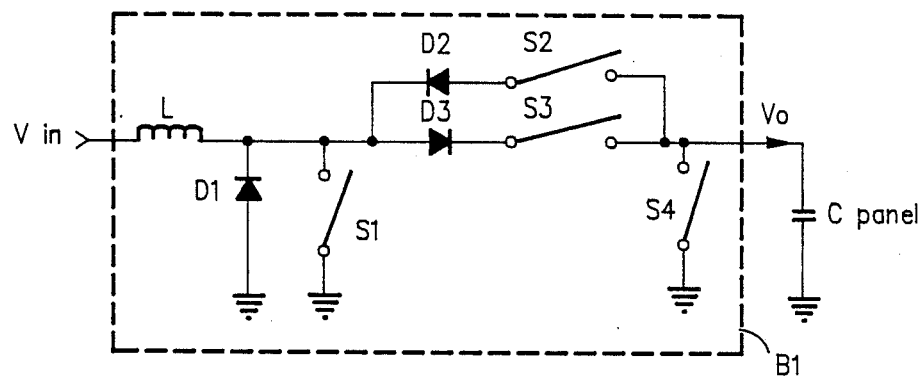
FIG. 4 is a schematic diagram of a first exemplary embodiment of the row driver circuit of the present invention.

With reference to the inventive circuit of FIG. 4, switches $S_2$ and $S_3$ are paired with diodes $D_2$ and $D_3$, so that, when the switches are "off," they need not withstand a bi-directional voltage swing. Assuming initially that the voltage across the EL panel's effectively or essentially capacitive row electrode load $C_{panel}$ is zero volts and that all switches are "off," if switch $S_1$ is pulsed "on," current will ramp up through the inductor L to a stored energy level of:

$$\tfrac{1}{2} I^2 L = \tfrac{1}{2} L \, (V_{in} \blacktriangle t / L)^2 = V_{in}^2 \, \blacktriangle t^2 / 2L$$

where
I is the final inductor current,
L is the inductance, and
$\blacktriangle t$ is the "on" time of switch $S_1$.

Figure 5:
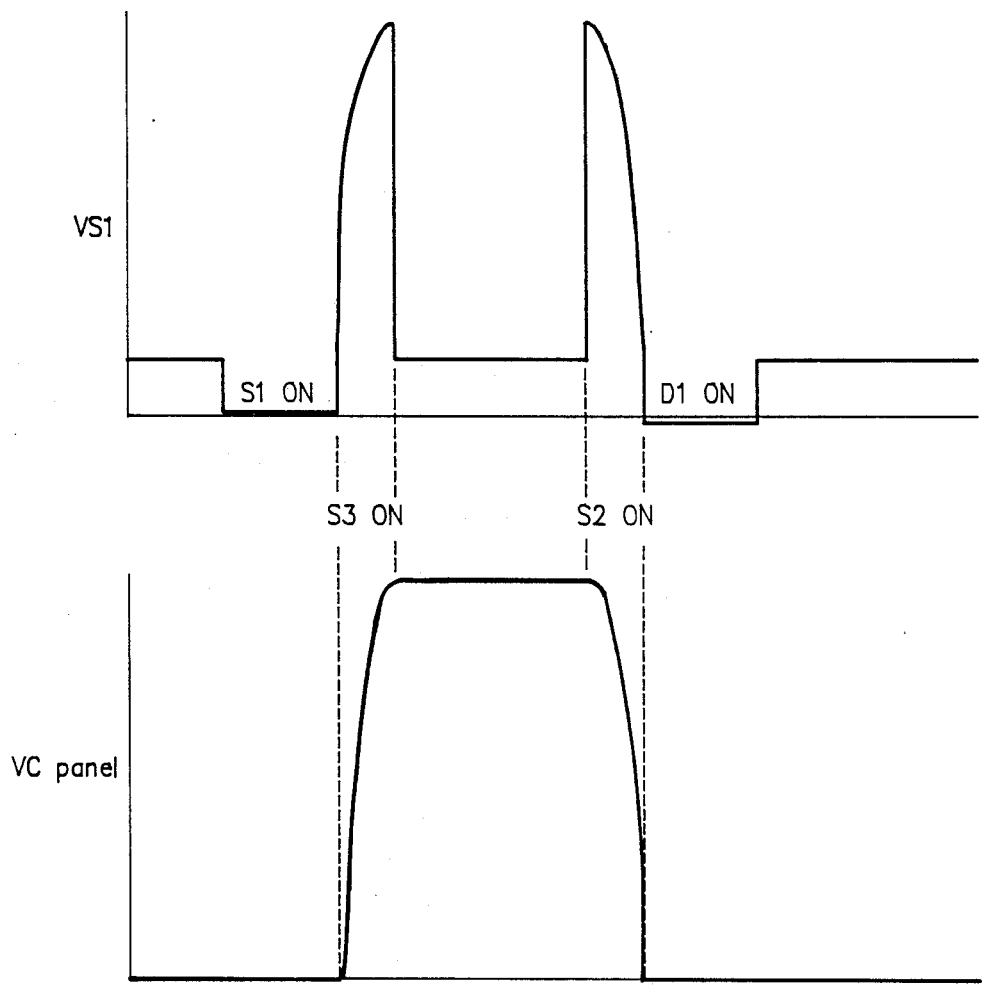
FIG. 5 is a graphical illustration concurrently showing the respective voltage levels across the switch $S_1$ and the panel's essentially capacitive row electrode load $C_{panel}$, which occur in the row driver circuit of FIG. 4 of the present invention.

As switch $S_3$ is turned "on" and $S_1$ is released, the inductor current flows through diode $D_3$, and the voltage across the panel's row electrode load $C_{panel}$ rings up, resonating with the inductance L to a final voltage $V_o$, as shown by the row driver wave form in FIG. 5.

By these means only the amount of energy needed to charge up the capacitive row electrode is actually transferred to the panel row. This limited amount of energy is not sufficient to damage the row electrode and the panel, even if a short circuit condition exits in the panel.

The final energy stored in panel $C_{panel}$, ignoring the negligible energy losses in the switching components, is equal to the energy that was stored in the inductor L, namely:

$$\tfrac{1}{2} C_{panel} V_o^2 = V_{in}^2 \, \blacktriangle t^2 / 2L$$

The final voltage $V_o$ is therefore given by:

$$V_o = V_{in} \blacktriangle t / \sqrt{(L \, C_{panel})}$$

Now, if switch $S_2$ is pulsed "on" and switch $S_3$ is turned "off," the voltage across the panel $C_{panel}$ rings down, resonating with the inductor L towards zero volts. As switch $S_2$ is released, current flowing through the inductor L now flows through $D_1$, and the electrical energy stored in the inductor L is finally dumped back into the power source $V_{in}$. This dumping back of the stored energy substantially improves the row driver's energy efficiency.

To insure that the final voltage across the panel $C_{panel}$ is zero volts, switch $S_4$ is turned "on," serving as a residual energy dumping switch means.

The situation becomes much more complex, if one wishes to switch the load, namely the essentially capacitive panel row load $C_{panel}$, down to negative voltages as well. In the circuit of FIG. 4, switch $S_4$ would have to withstand bi-directional voltage swings, and additional circuitry would be required for negative drive.

Figure 6:
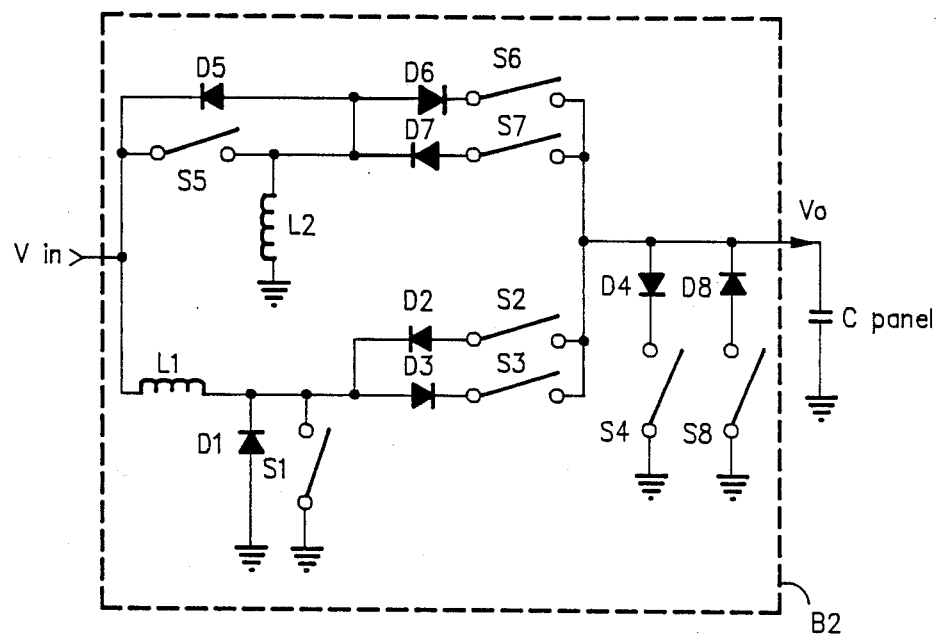
FIG. 6 is a schematic diagram of an alternate, exemplary embodiment of the row driver circuit of the present invention, which alternate circuit is used to switch the EL panel to negative voltages, as well as positive voltages.

Such a bi-direction, positive & negative voltage system is achieved in the alternate circuit of FIG. 6.

The bottom half of the circuit of FIG. 6, which is used to drive the capacitive row electrode low to positive voltages, is virtually identical in its components and operation, as the circuit of FIG. 4. Thus, its operation will not be repeated for the sake of brevity. However, negative voltages for the panel's row electrode load $C_{panel}$ will now be considered.

Assuming initially that the voltage on the panel row load $C_{panel}$ is zero volts and that all switches are "off," if switch $S_5$ is pulsed "on," current ramps through inductor $L_2$ to a stored energy level, as described above. As switch $S_7$ is turned "on" and switch $S_5$ is released, the inductor current flows through $D_7$, and the voltage across the panel's row load $C_{panel}$ rings down, resonating with the inductor $L_2$ to a final voltage $V_o$.

Similarly to the circuit of FIG. 4, the transferred energy yields a final voltage $V_o$, as follows:

$$V_o = -(V_{in} \blacktriangle t) / \sqrt{(L_2 \, C_{panel})}$$

where $\blacktriangle t$ is the "on" time of switch $S_5$.

To return the output voltage $V_o$ back to zero, switch $S_6$ is pulsed "on" and switch $S_7$ is turned "off." The panel $C_{panel}$ will ring, that is, resonate, with the inductor $L_2$ up to ground. As switch $S_6$ is released, current flowing through the inductor $L_2$ now flows through diode $D_5$, and the energy stored in inductor $L_2$ is finally dumped back into the power source $V_{in}$.

To insure that the final voltage across the load $C_{panel}$ is zero volts, switches $S_4$ and $S_8$ are turned "on."

The circuit shown in FIG. 6 thus provides all of the switching elements required to drive the load $C_{panel}$ to both positive and negative voltages.

It should be noted that the only critical timing wave forms required in the circuit of FIG. 6 are for switches $S_1$ and $S_5$, which control the peak positive and negative voltages applied across the row electrode load $C_{panel}$.

These peak voltages can be regulated using conventional pulse width modulator techniques. For example, a sample hold could be used to monitor the row pulse voltages and feed them back to a pulse width controller, which would adjust the critical pulse widths applied to the switches $S_1$ & $S_5$, thereby maintaining output regulation. This allows the use of an unregulated power source $V_{in}$ with the addition of feed forward control to the pulse width modulator.

Typically, most, if not all, of the circuit components of the circuits of FIGS. 4 & 6 would each be combined on a common printed circuit (PC) board $B_1$ & $B_2$, respectively.

Figure 7:
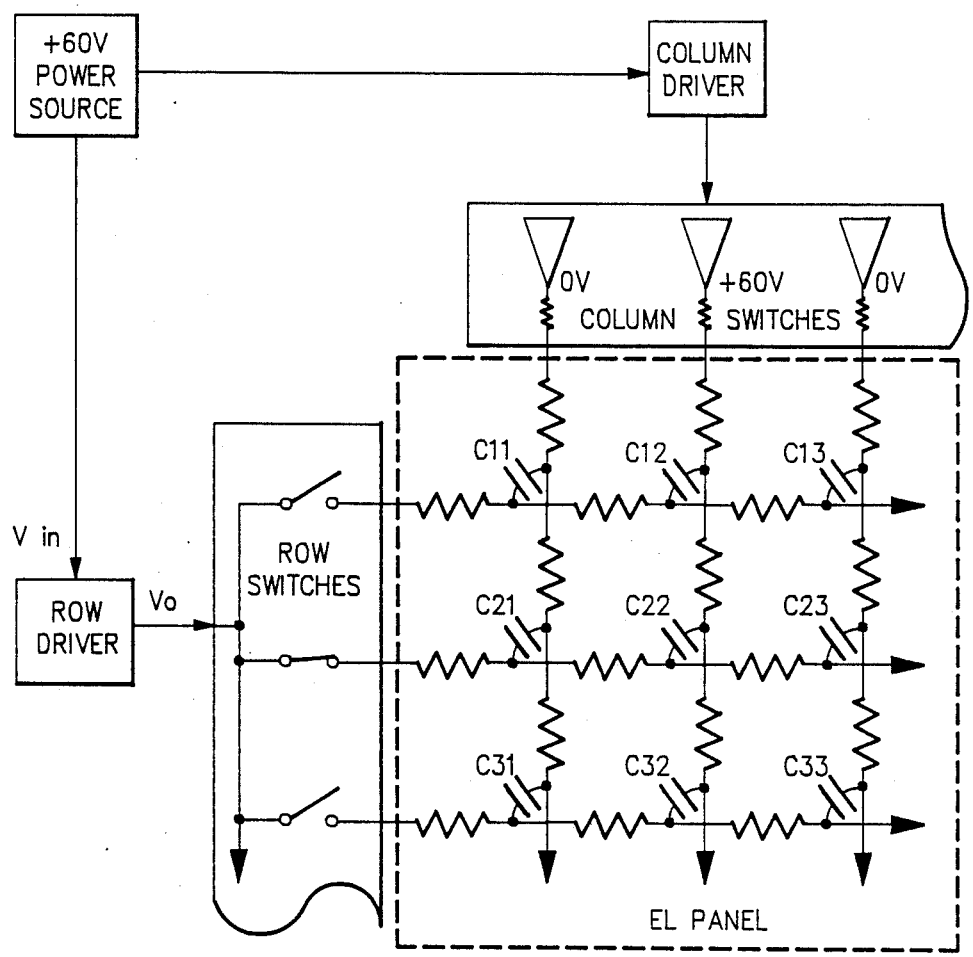
FIG. 7 is a generalized, block circuit diagram of an EL panel with its row and column drivers, with the two drivers being powered by the same power supply, in accordance with one aspect of the present invention.

As is standard in the art, the row drive wave form from, for example, the row drive circuit of either FIG. 4 or FIG. 6, is switched and sequenced for each row by standard chip circuitry (not illustrated), which circuitry is not part of the present invention, but is generally illustrated in FIG. 7. Likewise appropriate driver and sequencing circuitry is used, such as, for example, one of the standard circuits of the prior art, for the panel columns, which circuitry is also not part of the present invention.

As should be understood from the foregoing, the driver circuit of the present invention, as described in detail with respect to, for example, either FIGS. 4 or 6, requires only one power source, which can be unregulated, if so desired. In fact, the row driver of the invention can use the same $+60$ V power source typically required in the EL column driver circuit, as generally illustrated in FIG. 7.

As should be understood from the foregoing and the circuitry of FIGS. 4 & 6, the row drivers of the present invention will limit damage due to any inter-electrode shorts on the EL panel by limiting the energy transfer to each row. By limiting energy transfer to the row, IC component stresses are reduced to non-destructive levels, and the short on the EL panel will not have sufficient energy to destroy the electrode, which, if it would occur, would require panel replacement.

Additionally, although ground connections for the switches $S_1$, $S_4$ & $S_8$, diode $D_1$ and the capacitive load $C_{panel}$, as illustrated, are preferred, they could be connected to some other common voltage reference level, if so desired. Likewise, although the diodes of the circuits are used as unidirectional current limiting devices in association with the switches, some switches inherently have unidirectional current limiting flow characteristics, and for those types of components, the diodes would not be necessary.

The circuit concepts described herein may be applied to alternating current (AC), thin film plasma panels, as well as to electroluminescent drive schemes.

Although this invention has been shown and described with respect to detailed, exemplary embodiments thereof, it should be understood by those skilled in the art that various changes in form, detail, methodology and/or approach may be made without departing from the spirit and scope of this invention.

Having thus described at least one exemplary embodiment of the invention, that which is new and desired to be secured by Letters Patent is claimed below.

We claim:

1. In an electrical display panel system, including—
    a display panel having row and column electrodes, said panel being capable of displaying indicia thereon in response to appropriate electrical signals to said row and column electrodes from a row driver and column driver, respectively;
    at least one electrical power source ($V_{in}$);
    a column driver connected to a power source capable of electrically driving said column electrodes; and
    an output load, including said row electrodes ($C_{panel}$) of said panel, which load is essentially capacitive;
    a row driver capable of electrically driving said row electrodes, said row driver being powered by said power source; and
    row switches causing the drive signals from said row driver to be sequentially pulsed to said row electrodes;
    the improvement in said row driver comprising:
    an inductor being provided between the row driver power source and the row electrode panel load;
    a first switch ($S_1$ of FIG. 4; $S_1$ or $S_5$ of FIG. 6) with unidirectional current flow ($D_1$ of FIGS. 4 & 6) being connected to one end of said inductor and to a common voltage reference level, with said power source ($V_{in}$) being connected to the other end of said inductor; said first switch when closed allowing said power source to provide a current flow through said inductor, storing electrical energy in it;
    a second switch ($S_3$ of FIG. 4; $S_3$ or $S_7$ of FIG. 6) with unidirectional current flow ($D_3$; $D_3$ or $D_7$) being connected in series between the same end of said inductor as said first switch and the essentially capacitive row electrode load ($C_{panel}$) of the panel, which in turn is connected to said common voltage reference level; the opening of said first switch and closing of said second switch causing the electrical energy in said inductor to be provided to said capacitive row electrode load through said second switch, driving and charging said capacitive row electrode load;
    a third switch ($S_2$ of FIG. 4; $S_2$ or $S_6$ of FIG. 6) with unidirectional current flow ($D_2$; $D_2$ or $D_6$) being connected in series between the same end of said inductor as said first switch and the essentially capacitive row electrode load ($C_{panel}$) of the panel; the opening of said second switch and the closing of said third switch allowing the charged electrical energy in said inductor to be provided back from said capacitive row electrode load to said inductor through said third switch, re-energizing said inductor; the opening of said third switch allowing the energy in the re-energized inductor to be dumped back to said row driver power source.

2. The improved row driver of claim 1, wherein both positive and negative voltage levels are to be applied to said capacitive row electrode load, and wherein there is included a second inductor, forming with the other inductor lower ($L_1$) and upper ($L_2$) inductors, said power source being connected between the two inductors, with said upper inductor being connected to said common voltage reference level; and wherein there is further included:

a total of at least six switches ($S_1$-$S_3$ & $S_5$-$S_7$ of FIG. 6), at least some of which have unidirectional current limiting flow allowing them to withstand a bidirectional voltage swing; said first switch ($S_1$) being connected to the end of said lower inductor opposite to the end to which said power source is connected;

a fourth switch ($S_5$) being connected between said row driver power source and the end of said upper inductor opposite to its connection to said common voltage reference level;

fifth & sixth switches ($S_7$ & $S_6$, respectively) being connected in parallel with unidirectional current limiting flow of opposite polarity, said fifth and sixth parallel switches being connected in series between the opposite end of said upper conductor and said row load, alternately allowing the energy stored in said upper inductor to be transferred to said row load, driving it, and allowing the negative charge stored in said capacitive row load to re-energize said upper inductor, which in turn can be dumped back to said power source; said lower inductor being used to drive said capacitive row load to positive voltages and said upper inductor being used to drive said capacitive row load to negative voltages.

3. The improved row driver of claim 2, wherein there is further included:

eighth and ninth switches ($S_4$ & $S_8$, respectively of FIG. 6) of opposite polarity connected in parallel, forming further, residual energy dump switch means connected across said row electrode load and said common voltage reference level; the closing of said switch means dissipating any remaining voltage charge on said capacitive row electrode load after it has re-energized said inductor.

4. The improved row driver of claim 2, wherein there is included a series of diodes connected in series with said second, third, fifth and sixth switches, providing said unidirectional current flow for the switches.

5. The improved row driver of claim 1, wherein there is further included:

further, residual energy dump switch means ($S_4$ of FIG. 4; $S_4$ or $S_8$ of FIG. 6) connected across said row electrode load and said common voltage reference level; the closing of said residual energy dump switch means dissipating any remaining charge on said capacitive row electrode load to said common voltage reference level.

6. The improved row driver of claim 1, wherein there is included only one power source powering both said row driver and said column driver.

7. The improved row driver of claim 1, wherein said panel is an electroluminescent (EL) panel.

8. The improved row driver of claim 1, wherein there is included a series of diodes connected in series with said second and third switches, providing said unidirectional current flow for the switches.

9. The improved row driver of claim 1, wherein said common voltage reference level is ground.

10. A method of improving the row driver for a electrical display panel system, which system includes— a display panel having row and column electrodes, said panel being capable of displaying indicia thereon in response to appropriate electrical signals to said row and column electrodes from a row driver and column driver, respectively;

at least one electrical power source ($V_{in}$);

a column driver connected to a power source capable of electrically driving said column electrodes; and an output load, including said row electrodes ($C_{panel}$) of said panel, which load is essentially capacitive;

a row driver capable of electrically driving said row electrodes, said row driver being powered by said power source; and row switches causing the drive signals from said row driver to be sequentially pulsed to said row electrodes;

comprising the following step(s):

providing an inductor between the row driver power source and the row electrode panel load; and providing a first switch ($S_1$ of FIG. 4; $S_1$ or $S_5$ of FIG. 6) with unidirectional current flow ($D_1$ of FIGS. 4 & 6) connected to one end of said inductor and to a common voltage reference level, with said power source ($V_{in}$) being connected to the other end of said inductor;

closing said first switch, allowing said power source to provide a current flow through said inductor, storing electrical energy in it;

providing a second switch ($S_3$ of FIG. 4; $S_3$ or $S_7$ of FIG. 6) with unidirectional current flow ($D_3$; $D_3$ or $D_7$) connected in series between the same end of said inductor as said first switch and the essentially capacitive row electrode load ($C_{panel}$) of the panel, which in turn is connected to said common voltage reference level;

opening said first switch and closing said second switch, causing the electrical energy in said inductor to be provided to said capacitive row electrode load through said second switch, driving and charging said capacitive row electrode load;

providing a third switch ($S_2$ of FIG. 4; $S_2$ or $S_6$ of FIG. 6) with unidirectional current flow ($D_2$; $D_2$ or $D_6$) connected in series between the same end of said inductor as said first switch and the essentially capacitive row electrode load ($C_{panel}$) of the panel;

opening said second switch and closing said third switch, allowing the charged electrical energy in said inductor to be provided back from said capacitive row electrode load to said inductor through said third switch, re-energizing said inductor; and opening said third switch allowing the energy in the re-energized inductor to be dumped back to said row driver power source.

11. The method of claim 10, wherein there is included the following step(s):

applying both positive and negative voltage levels to said capacitive row electrode load, and wherein there is included a second inductor, forming with the other inductor lower ($L_1$) and upper ($L_2$) inductors, said power source being connected between the two inductors, with said upper inductor being connected to said common voltage reference level; and wherein there is further included the step(s) of:

providing a total of at least six switches ($S_1$-$S_3$ & $S_5$-$S_7$ of FIG. 6), at least some of which have unidirectional current limiting flow allowing them to withstand a bi-directional voltage swing; said first switch ($S_1$) being connected to the end of said lower inductor opposite to the end to which said power source is connected;

providing a fourth switch (S$_5$) connected between said row driver power source and the end of said upper inductor opposite to its connection to said common voltage reference level;

providing fifth & sixth switches (S$_7$ & S$_6$, respectively) connected in parallel with unidirectional current limiting flow of opposite polarity, said fifth and sixth parallel switches being connected in series between the opposite end of said upper conductor and said row load;

alternately allowing the energy stored in said upper inductor to be transferred to said row load, driving it, and allowing the negative charge stored in said capacitive row load to re-energize said upper inductor, and in turn dumping the energy of said re-energized upper conductor back to said power source; and using said lower inductor to drive said capacitive row load to positive voltages and using said upper inductor being used to drive said capacitive row load to negative voltages.

12. The method of claim 10, wherein there is included the following step(s):

transferring the charging energy to said row electrodes only through said inductor, limiting energy transfer to each row electrode to low levels, reducing integrated component stress to non-destructive levels in the event of an electrode short on the panel, preventing the destruction of the driver integrated circuits, which would otherwise cause the shorted electrode itself to burn out on the panel.

13. The method of claim 10, wherein there is further included the following step(s):

regulating peak voltages by using pulse width modulator techniques, allowing the use of an unregulated power source with the addition of feed forward control.

14. A method of improving the row driver for a electrical display panel system, which system includes— a display panel having row and column electrodes, said panel being capable of displaying indicia thereon in response to appropriate electrical signals to said row and column electrodes from a row driver and column driver, respectively;

at least one electrical power source;

a column driver connected to a power source capable of electrically driving said column electrodes; and an output load, including said row electrodes (C$_{panel}$) of said panel, which load is essentially capacitive;

a row driver capable of electrically driving said row electrodes, said row driver being powered by said power source; and row switches causing the drive signals from said row driver to be sequentially pulsed to said row electrodes;

comprising the following step(s):

providing an inductor coupling between the row driver power source and the capacitive row electrode panel load, the charging, driving energy for said capacitive row electrode panel load being provided to it only through said inductor coupling;

flowing current through said inductor, storing electrical energy in said inductor;

using said energized inductor to charge up the capacitive row electrode load, driving in sequence the row electrodes; and after driving a row electrode, using the charge on the capacitive row electrode load to re-energize the inductor; and dumping the energy in the re-energized inductor into the power supply; reducing the amount of energy consumption of said row driver and limiting the amount of driving energy supplied to the row electrode to that of the inductor.

15. The method of claim 14, wherein there is included the following step(s):

applying both positive and negative voltage levels to said capacitive row electrode load, and wherein there is included two inductors, an upper inductor and a lower inductor, and wherein there is further included the step(s) of:

using one of said inductors to drive said capacitive row load to positive voltages and using the other inductor to drive said capacitive row load to negative voltages.

* * * * *